United States Patent [19]

Hauck et al.

[11] 4,429,453

[45] Feb. 7, 1984

[54] PROCESS FOR ANODIZING SURFACE OF GATE CONTACT OF CONTROLLED RECTIFIER HAVING INTERDIGITATED GATE AND EMITTER CONTACTS

[75] Inventors: James H. Hauck, Hermosa Beach; Anders Nilarp; Thomas J. Roach, both of Rancho Palos Verdes, all of Calif.

[73] Assignee: International Rectifier Corporation, Los Angeles, Calif.

[21] Appl. No.: 251,267

[22] Filed: Apr. 6, 1981

[51] Int. Cl.³ .................................... H01L 21/283
[52] U.S. Cl. .................................... 29/591; 29/571; 357/68
[58] Field of Search ............... 29/571, 589, 590, 591; 357/68; 204/42, 15

[56] References Cited

U.S. PATENT DOCUMENTS 4,174,562 11/1979 Sanders et al. ............... 29/590 X
4,320,571 3/1982 Hauck ............................. 29/591

Primary Examiner—Brian E. Hearn
Assistant Examiner—Alan E. Schiavelli
Attorney, Agent, or Firm—Ostrolenk, Faber, Gerb & Soffen

[57] ABSTRACT

Coplanar interdigitated gate and emitter contacts are accessible at the surface of a large area wafer forming a high power, high speed controlled rectifier. A pressure contact is made to the emitter contact which is raised above the level of the gate contact. The upper surface of the gate contact is anodized to provide an insulation layer which prevents accidental shorting of the gate to the emitter contact.

6 Claims, 9 Drawing Figures

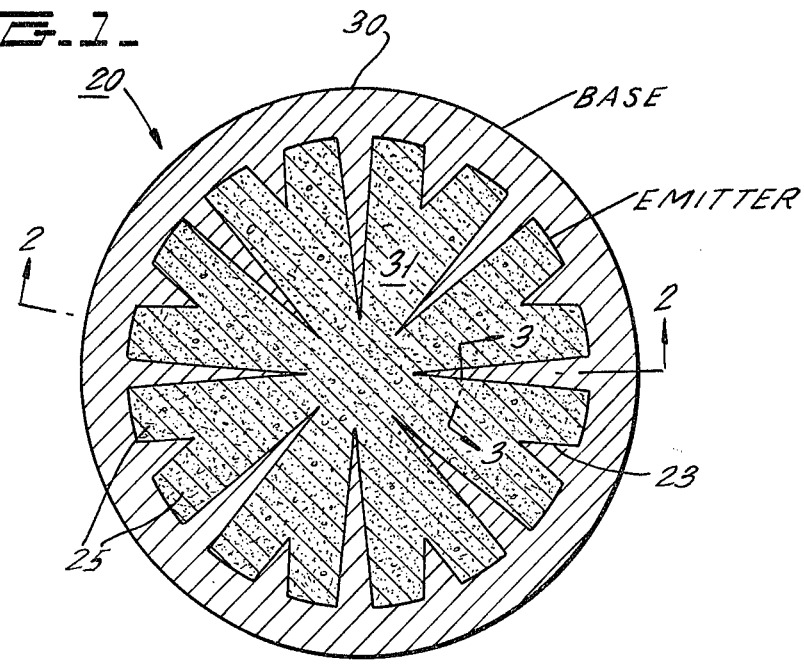
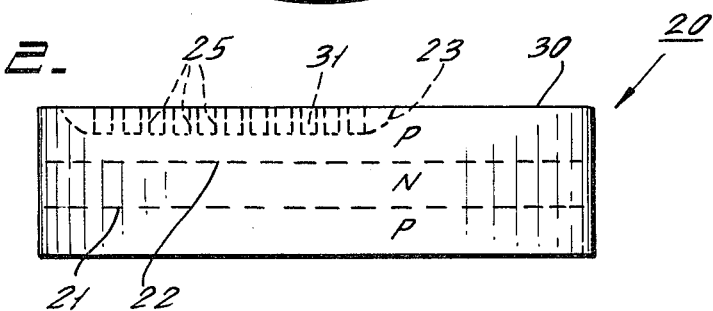
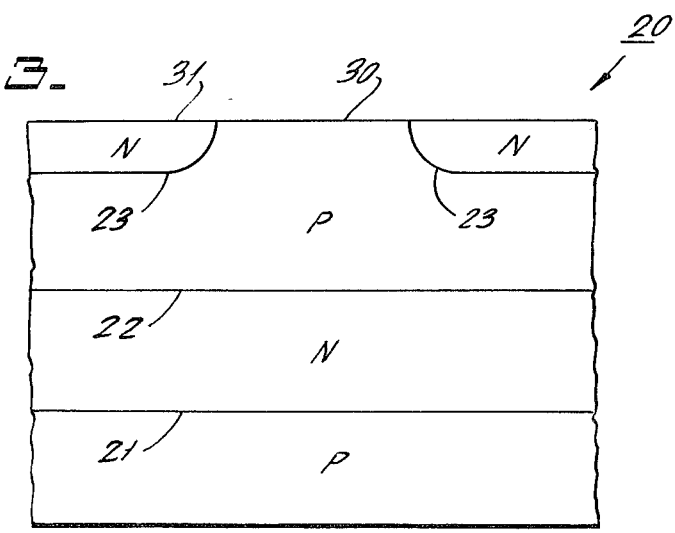

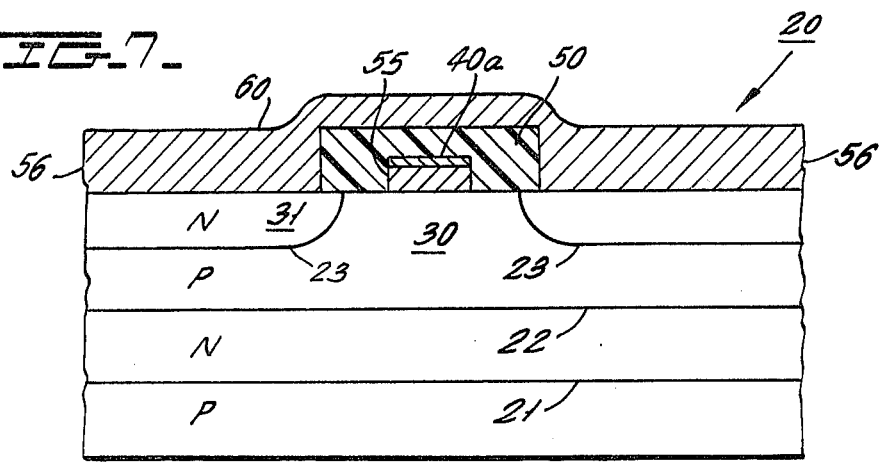
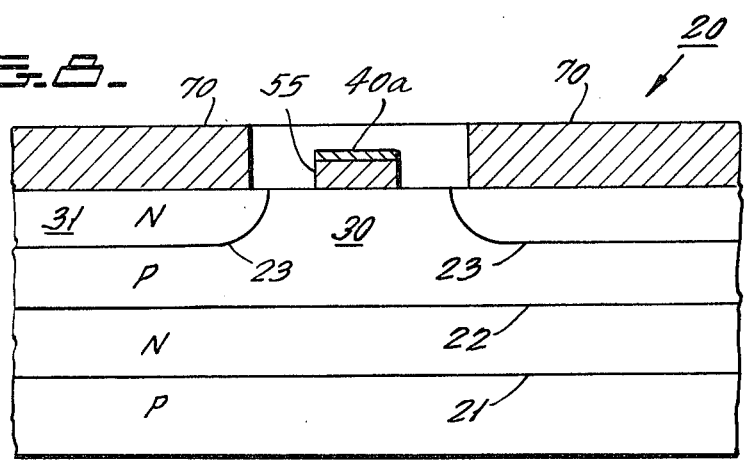
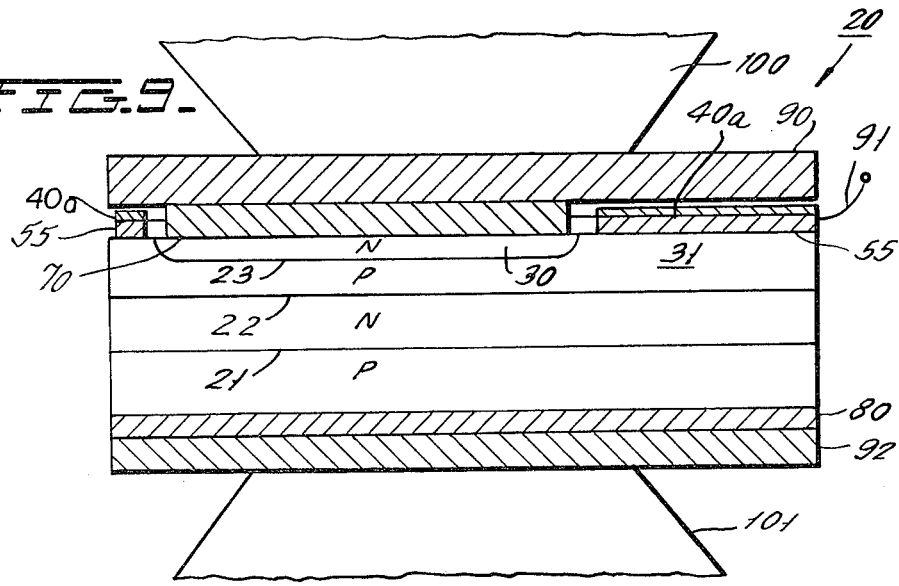

PROCESS FOR ANODIZING SURFACE OF GATE CONTACT OF CONTROLLED RECTIFIER HAVING INTERDIGITATED GATE AND EMITTER CONTACTS

RELATED APPLICATIONS

This application is related to copending application Ser. No. 196,684, filed Oct. 14, 1980, in the name of James H. Hauck, entitled STENCIL MASK FOR HIGH POWER, HIGH SPEED CONTROLLED RECTIFIERS and is assigned to the assignee of the present invention, now U.S. Pat. No. 4,320,571.

BACKGROUND OF THE INVENTION

This invention relates to high speed, high power silicon controlled rectifiers, and more specifically relates to a novel silicon controlled rectifier and process for manufacture thereof which allows connection of a flat pressure contact to the upper surface of an emitter contact while preventing accidental contact to the surface of a gate contact which is interdigitated with the emitter contact.

High speed, high power controlled rectifiers in which contact is made to the emitter contact layer by a molybdenum expansion plate or the like are well known. Such devices are shown, for example, in U.S. Pat. No. 3,609,476.

In order to make the silicon controlled rectifier or thyristor operate at as high a speed as possible, it is preferable to interdigitate the gate and emitter contacts so that the device will turn on over its full area as rapidly as possible and thus be capable of operation with a high rate of rise of anode to cathode current. When the device is to have high current capacity and is made of a relatively large area wafer, it is also desired to make pressure contact to the device through the above-described expansion plate which has thermal coefficient expansion characteristics similar to those of silicon. The expansion plate is pressed into high pressure contact with the emitter contact. A gate lead is then connected to the gate area which is interdigitated with the emitter.

Copending application Ser. No. 196,684, noted above, discloses a novel method for building up the emitter contact layer to a level above that of the gate contact layer which is interdigitated therewith, which method lends itself to high production rates and inexpensive processing. Other processes are known for making interdigitated contacts which are flat but terminate in spaced, parallel planes. With this kind of structure, an expansion plate can make high pressure contact with the emitter contact surface. However, it has been found that the expansion plate can deflect enough or otherwise contact the gate contact surface, thus shorting the gate contact to the emitter contact.

BRIEF DESCRIPTION OF THE INVENTION

In accordance with the invention, the upper surface of the gate contact is anodized to ensure that the surface is insulated against accidental shorting to the emitter contact. The anodizing layer has a thickness of about 3 to 5 microns and will have a voltage withstandability far in excess of the possible emitter-to-gate voltage which might be imposed across the anodizing layer. Moreover, the oxide or anodized layer has good temperature and time stability and can be dissolved in chemicals that will not attack photoresist layers. Thus, the anodizing which is an aluminum oxide layer can be incorporated directly into the process of manufacture of the device disclosed in above-noted copending application Ser. No. 196,684 without substantial change in the existing process.

A preferred method for manufacturing the device employing the present invention uses a silicon wafer which is first processed in the usual manner to have interdigitated emitter and gate layers terminating on the surface of the wafer. A thin layer of metal, preferably aluminum, is then deposited over the entire upper surface of the device and the upper surface of this aluminum layer is then anodized to a thickness of about 5 microns, which is sufficient to withstand a voltage of several hundred volts across the layer. The anodizing process can be carried out by immersing the wafer in a dilute sulfuric or chromic acid and then passing current through the device until from 3 to 5 microns of aluminum oxide builds up. This thickness is not critical and it is sufficient to have a layer thickness which is pinhole-free and sufficient to withstand about 200 volts.

An appropriate photolithographic mask is then applied to the upper metal surface and a window is formed in the mask which follows the path taken by the junction between the emitter and gate layers. The contact material overlying this boundary is then removed as by etching through the anodizing and aluminum to separate the emitter and gate contacts. Thereafter the entire upper surface is covered with a second photolithographic mask which extends over the gate metallizing and across the exposed silicon surface containing the junction between the emitter and gate layers. The anodizing layer which is exposed by the mask is etched away by dilute hydrofluoric acid, but the photoresist mask remains intact. A second metal layer, preferably aluminum, which may be thicker than the first layer, is then deposited over the entire upper surface of the device. The second layer is sintered in a suitable sintering operation such that the second metal layer sinters to the first metal layer which covers the upper semiconductor surface. However, that portion of the second metal layer overlying the photoresist pattern will not sinter to the underlying first layer, and the photoresist mask disintegrates during the sintering operation. The portion of the second aluminum layer overlying the photoresist can then be lifted off or washed from the upper surface of the device after the sintering operation is completed. Note that the anodizing layer of aluminum oxide remains atop the portion of the first metal layer which underlies the photoresist pattern.

As a result of the process, the contact on the emitter region will have the thickness of the two metal layers, whereas the contact to the base region will have the thickness of only the first metal layer. Thus, there is formed a structure in which the emitter layer has a substantially higher level than the base layer so that a flat expansion contact can make contact to the emitter contact metal without short-circuiting to the base. Moreover, the upper surface of the contact to the base layer will be covered by an insulating anodizing coating which will prevent accidental contact between the emitter and base layers through the expansion plate which is later connected to the top surface of the emitter contact.

BRIEF DESCRIPTION OF THE DRAWINGS

FIG. 1 is a top view of a wafer of semiconductor material after base and emitter junctions have been formed therein by appropriate diffusion techniques or the like.

FIG. 2 is a cross-sectional view of the wafer of FIG. 1.

FIG. 3 is a cross-sectional view of the wafer of FIG. 1 taken across the section line 3—3 in FIG. 1.

FIG. 7 shows the next step in the process of the invention wherein the photoresist layer of FIG. 6 has been processed and the mask is washed away from the emitter contact layer, and further shows the subsequent deposition of a second metal layer atop the fully exposed emitter surface.

FIG. 8 shows the next step in the process of the invention wherein the second metal layer deposited in the step of FIG. 7 has been sintered and the second metal layer overlying the photoresist has been lifted off and removed.

FIG. 9 is a cross-sectional view of the subsequently completed device taken across a section line such as the section line 2—2 in FIG. 1 and shows the device assembled with expansion plates between opposing pressure poles.

DETAILED DESCRIPTION OF THE DRAWINGS

Figure 4:
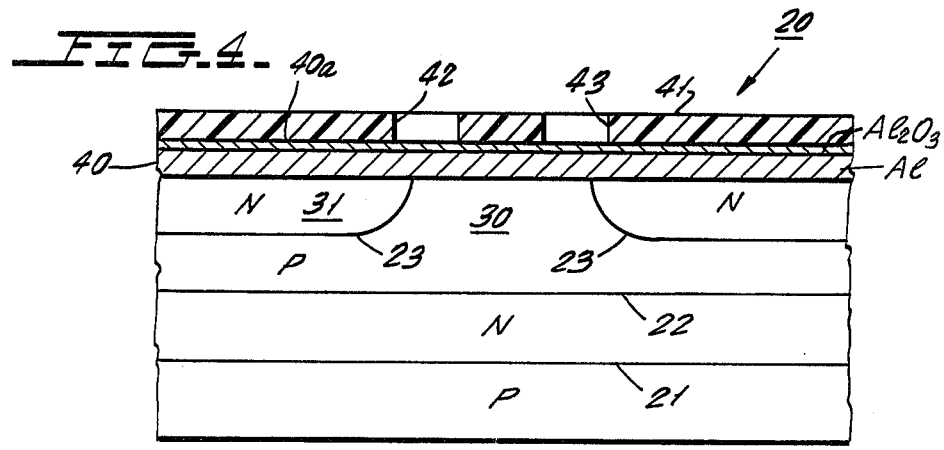
FIG. 4 shows the section of FIG. 3 after the formation thereon of a first aluminum layer followed by the anodizing of the upper surface of the aluminum layer, followed by the formation of a photoresist layer which has been hardened by suitable processing to define a mask exposing only a region spanning the junction between the interdigitated emitter and base of the device of FIGS. 1 to 4.

Referring first to FIGS. 1 and 2, there is shown therein a basic wafer containing the junctions needed to make the device a high speed controlled rectifier having interdigitated base and emitter contacts. In FIGS. 1 and 2, the wafer consists of a monocrystalline silicon wafer 20 which could, for example, have a diameter of about one inch and a thickness of about 15 mils.

By appropriate processing, the necessary junctions are formed. These include junctions 21, 22 and an emitter-gate junction 23, which is an extremely long area created by the interdigitation of the gate and emitter regions to ensure turn-on of the device over a large area so that the device can have a high rate of rise of current during turn-on.

A particular pattern has been selected to illustrate the device in FIG. 1, but it will be apparent to those skilled in the art that any interdigitated pattern could be used in connection with the invention. It should also be understood that the invention can also apply to any device, including power transistors, triacs, and the like which have at least two contacts on one surface which are to be selectively contacted by a pressure contact.

FIG. 1 illustrates a plurality of P-type regions 25 which extend from the layer above junction 22 through the emitter layer above junction 23. These regions 25 are small P-type regions distributed over the emitter to impart shorted emitter characteristics to the device, thereby to control the rate of rise of voltage characteristics of the device, as well known.

The junction 23 in FIG. 1 divides the gate region 30 from the central emitter area 31. It is necessary to make electrical contact to both the layers 30 and 31. The contact to layer 31 in the case of a high current rated device should preferably be a pressure contact through the medium of an expansion plate of molybdenum or the like.

In accordance with the present invention, a novel method is provided for placing the gate and emitter contact metallizing on the upper surface of the device of FIGS. 1 and 2 so that the level of the emitter metallizing is above that of the gate metallizing and covering the gate metallizing with an insulation layer, thus enabling pressure contact to the emitter metal without contact to the base which would short-circuit the emitter and gate regions.

One process which can be used to carry out the invention is described in connection with FIGS. 3 to 9 wherein FIG. 3 is the section seen across line 3—3 of FIG. 1. It will be understood that the metallizing patterns for the emitter region 31 and base region 30 will extend over the full geometry of their respective areas.

The first step in the process of the invention is the deposition of a first metal layer 40, which may be aluminum, having a thickness from 0.1 mil to about 0.5 mil. Other thicknesses and other metals could be used. The aluminum layer 40 may be applied to the upper surface of the wafer by sputtering or by evaporation techniques.

In accordance with the invention, the upper surface of layer 40 is anodized by any conventional process to form an aluminum oxide coating 40a having a thickness from 3 to 5 microns. The process may employ immersion of the wafer in chromic acid and passing a current through the solution until the desired layer thickness is obtained. A layer thickness of 3 microns can withstand a voltage of more than about 200 volts which is much greater than the expected cathode-to-gate voltage of a few volts which would normally be impressed across layer 40a.

Thereafter, a photoresist mask 41 is formed on top of the first aluminum layer 40 and aluminum oxide layer 40a. Through suitable photoresist processing techniques, an elongated window 42, which follows the path of junction 23 at the wafer surface, is formed in the photo mask 41 and has a width of about 6 mils. Note that, in FIG. 4, two sections of the window 42 are seen and, for convenience, are labeled sections 42 and 43. Note that the photoresist chemicals do not attack the aluminum oxide layer 40a.

Figure 5:
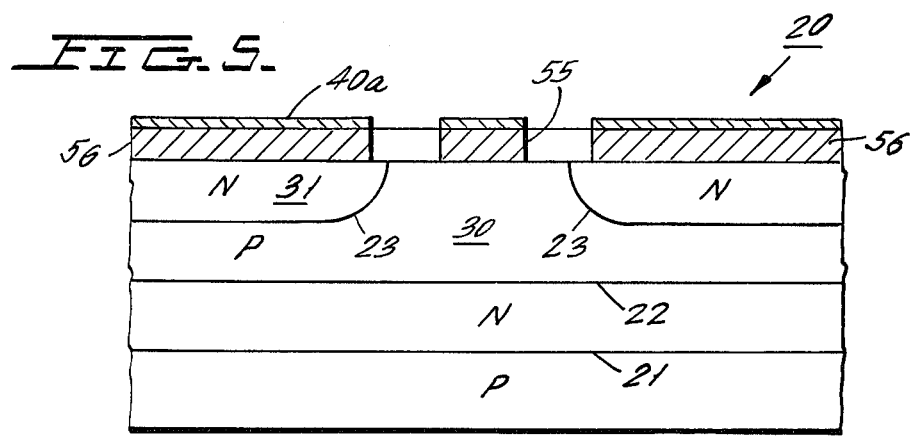
FIG. 5 shows the next step in the process of the invention wherein the underlying aluminum layer is etched through the mask defined in FIG. 4 and the mask material is removed.

Thereafter, an aluminum etch is carried out through the windows 42 and 43 to etch the underlying aluminum layers 40 and 40a from the surface of the device in a region extending across the junction 23 as shown in FIG. 5. This separates the aluminum layer 40 into two insulated layers 55 and 56 on the emitter and gate regions, respectively, each having its overlying oxide layer 40a. The aluminum etch can be carried out by a mixture of dilute nitric acid, phosphoric acid and water or by dilute hydrofluoric acid or the like.

The aluminum layer 40 is then sintered, for example, at a temperature between 400° and 577° C. in order to sinter the aluminum into the gate and emitter regions on the surface of wafer 20, and in order to decompose the photoresist mask 41 of FIG. 4 and remove the mask.

As an alternative method of manufacture, the first step of the process is the formation of the photoresist pattern 41 directly on the upper surface of the silicon wafer at regions which are to be free of metallization. The first metal layer 40 of FIG. 4 is then deposited over the photoresist mask and the metal is sintered, causing the underlying photoresist to decompose and the metal atop the decomposed photoresist to lift off. The arrangement of FIG. 5 is then produced without requiring a metal etching step.

Figure 6:
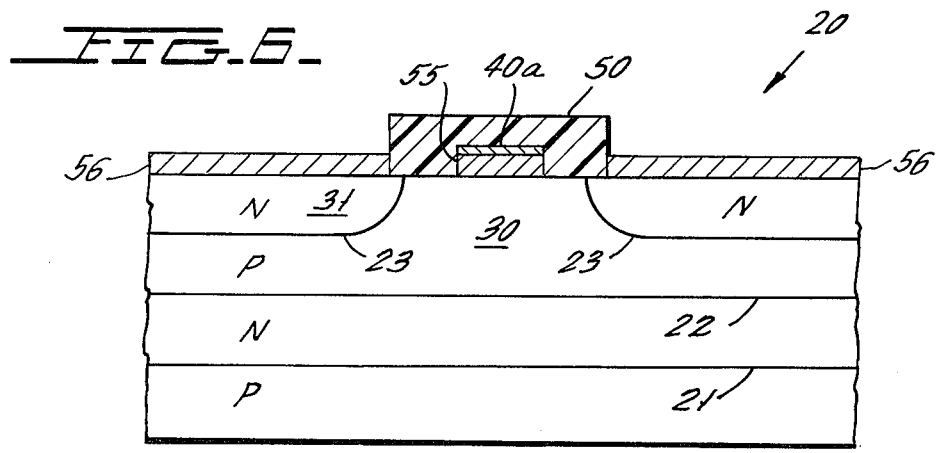
FIG. 6 shows the next step in the process of the invention, wherein a second photoresist layer is deposited atop the structure of FIG. 5 and the exposed anodizing layer is removed by etching.

Thereafter and as shown in FIG. 6, a second photoresist mask 50 is deposited over the upper surface of the first aluminum layer sections 55 and 56. Note that the photoresist layer 50 fills in the gap between the aluminum layer sections 55 and 56 which is the exposed silicon band lying atop and spanning the full length of junction 23. Thereafter and using conventional photolithographic techniques, the photolithographic material 50 overlying gate electrode section 55 and the exposed silicon in the gap containing junction 23 is exposed to ultraviolet light through a mask and is hardened, and the mask portion overlying emitter layer section 56 is washed away.

The exposed aluminum oxide layer overlying the emitter contact is then removed without affecting the photoresist covering the gate contact. For example, the aluminum oxide coating exposed by mask 50 is removed by etching in dilute hydrofluoric acid, which does not attack the photoresist mask.

Thereafter and as shown in FIG. 7, a second metal layer 60 is deposited over the full surface of the device including the underlying layer 56 and the photoresist 50. The second metal layer 60 can be of any desired metal, preferably aluminum, and may have any desired thickness preferably equal to or greater than the thickness of layer 40. For example, layer 60 may have a thickness of about 1 mil.

The wafer is then placed in a sintering furnace to sinter the layer 60 to underlying layer 56. This sintering temperature can, for example, be from 400° to 577° C.

During the sintering operation, the photoresist 50 beneath layer 60 decomposes and the portion of layer 60 which is atop the photoresist 50 will not adhere and lift off. The aluminum of layer 60 overlying layer 56 will, however, remain intact and sinter with layer 56.

The resulting device is then suitably washed and etched and will have the appearance shown in FIG. 8, wherein the emitter contact metal 70, which is the sintered combination of the two layers 56 and 60 will have a thickness of about 1.5 mils, whereas the original base contact layer 55 will have its original thickness of about 0.5 mil. Thus the emitter layer 70 lies substantially above the level of the base layer 53. Note that the upper surfaces of layers 70 and 55 will be very flat and will lie in parallel planes. This then enables connection by a flat molybdenum expansion plate or a flat upper pole to the emitter layer 70 during the assembly of the device. Note particularly in FIG. 8 that the aluminum oxide layer 40a remains atop layer 55 to insulate the top surface of the contact 55 from accidental contact to a contact which stands across the emitter contact 70.

Following the sintering of the aluminum layer 70, the contact surfaces can be nickel-plated for 15 minutes and then gold-plated for 10 minutes. A wax is then sprayed on the front of the device and the device may be bevel-lapped (not shown). Thereafter a polish etch can be used. The gate is then bonded to an aluminum pad (not shown) and a final etch prepares the device to receive the expansion plates.

The finally completed wafer is shown in cross-section in FIG. 9 through a section similar to section 2—2 in FIG. 1, where the device is shown as having the raised emitter contact 70 and relatively low height base contact 55 covered by insulation layer 40a. FIG. 9 also shows an anode contact layer 80 applied to the rear surface of the device.

FIG. 9 further shows a molybdenum expansion plate 90 which can, for example, have a thickness of 35 mils and perfectly flat opposing surfaces, pressed into contact with the emitter layer 70 without fear of accidental contact to the base layer 55. Note that a suitable gate lead 91 is attached to the base layer 55 in FIG. 9.

A second molybdenum expansion plate 92 can be connected to the back side of the wafer, and the device is then suitably mounted between two copper pole pieces 100 and 101 which are pressed against the molybdenum expansion plates 90 and 92, respectively, in order to make good electrical connection to the main electrodes of the wafer 20 in the usual manner.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. The process of manufacture of a high power semiconductor device comprising the steps of:
   forming an interdigitated emitter region and gate region which terminate adjacent opposite sides of an elongated junction extending over one surface of a semiconductor wafer;
   forming a first metal layer atop the full area of said one surface;
   anodizing the upper surface of said first metal layer;
   removing said first metal layer from a thin elongated region spanning across said junction at said one surface to define separate emitter and gate region contacts;
   forming a photoresist mask over the portion of said one surface exposed by the removal of said thin elongated region of metal removed from said first metal layer and over the portions of said first metal layer atop said gate region;
   removing the anodizing from the portions of said first metal layer which are exposed by said photoresist mask;
   forming a second metal layer atop the full area of said first metal layer and atop said photoresist mask;
   sintering said second metal layer into said first metal layer to define an emitter contact of thickness equal to the combined thickness of said first and second metal layers; and decomposing said photoresist mask during said sintering step;
   removing the region of said second metal layer from atop said photoresist mask to define a gate contact having a thickness defined by the thickness of said first layer and covered by said anodized layer;
   and applying the flat surface of a rigid conductive expansion plate electrode to the upper exposed surface of said second metal layer, with said flat surface physically spaced from the upper surface of said anodized layer on said gate contact.

2. The process of claim 1, wherein said first and second metal layers are aluminum.

3. The process of claim 1 or 2 wherein said first metal layer has a thickness greater than about 0.1 mil and wherein said anodized layer has a thickness greater than about 3 microns.

4. The process of claim 3, wherein said second metal layer has a thickness of at least twice the thickness of said first metal layer.

5. The process of claim 1 or 2, wherein said elongated region in said first layer is removed by etching through a first photolithographic mask, and wherein said first metal layer is sintered to said silicon wafer after removal of said elongated region of said first metal layer to secure said first metal layer to said wafer and to decompose said first photolithographic mask.

6. The process of claim 5, wherein said first metal layer has a thickness of about 0.5 mil and said second metal layer has a thickness of about 1.0 mil.

* * * * *